(12) United States Patent
Nelson et al.

(10) Patent No.: US 11,614,995 B2
(45) Date of Patent: Mar. 28, 2023

(54) DUAL REDUNDANT MEMORY RADIATION HARDENING

(71) Applicant: Honeywell International Inc., Charlotte, NC (US)

(72) Inventors: David K. Nelson, Medicine Lake, MN (US); Robert Rabe, Chanhassen, MN (US); Keith Goike, Minneapolis, MN (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 17/450,716

(22) Filed: Oct. 13, 2021

(65) Prior Publication Data

US 2022/0197738 A1 Jun. 23, 2022

Related U.S. Application Data

(60) Provisional application No. 63/199,349, filed on Dec. 21, 2020.

(51) Int. Cl.
*G06F 11/10* (2006.01)
*G11C 15/04* (2006.01)

(52) U.S. Cl.
CPC .......... *G06F 11/1004* (2013.01); *G11C 15/04* (2013.01)

(58) Field of Classification Search
CPC .. G06F 11/1004; G06F 11/1064; G11C 15/04; G11C 29/52; G11C 2029/0411
USPC ......................................................... 714/801
See application file for complete search history.

(56) References Cited

U.S. PATENT DOCUMENTS

| | | | |
|---|---|---|---|
| 6,597,595 B1 * | 7/2003 | Ichiriu | G11C 15/00 365/201 |
| 6,707,693 B1 * | 3/2004 | Ichiriu | G11C 15/00 711/108 |
| 6,870,749 B1 | 3/2005 | Park et al. | |
| 7,019,999 B1 * | 3/2006 | Srinivasan | G11C 15/04 365/49.1 |
| 7,050,318 B1 * | 5/2006 | Argyres | G11C 15/04 365/189.07 |

(Continued)

OTHER PUBLICATIONS

Hung, "Soft-Error Tolerant Cache Architectures," Computer Science, (Applicant points out, in accordance with MPEP 309.04(a), that the year of publication, 2007, is sufficiently earlier than the effective U.S. filing date, so that the particular month of publication is not in issue.) 117 pp.

(Continued)

*Primary Examiner* — Albert Decady
*Assistant Examiner* — Enam Ahmed
(74) *Attorney, Agent, or Firm* — Shumaker & Sieffert, P.A.

(57) ABSTRACT

A method for storing data includes determining, using a first match line, that a match word satisfies a first content addressable memory (CAM) word stored in a CAM array, wherein the CAM array is configured to store a second CAM word that matches the first CAM word. The method further includes determining that a first parity bit associated with the first CAM word matches a first parity of the first CAM word. The method further includes, in response to determining that the first parity bit associated with the first CAM word matches the first parity determining, using the first match line, a first random access memory (RAM) word stored in a RAM array and outputting the first RAM word.

20 Claims, 9 Drawing Sheets

(56) References Cited

U.S. PATENT DOCUMENTS

| | | | |
|---|---|---|---|
| 7,254,748 B1 | 8/2007 | Wright et al. | |
| 7,257,763 B1* | 8/2007 | Srinivasan | G11C 29/44 |
| | | | 714/764 |
| 7,350,137 B2 | 3/2008 | Foss et al. | |
| 7,526,709 B2 | 4/2009 | Regev et al. | |
| 7,761,774 B2 | 7/2010 | Fischer et al. | |
| 8,473,832 B2 | 6/2013 | Wickeraad | |
| 8,522,087 B2* | 8/2013 | Koudele | G11C 11/5642 |
| | | | 714/701 |
| 8,533,578 B2 | 9/2013 | Ramaraju et al. | |
| 9,146,808 B1 | 9/2015 | Butler et al. | |
| 2003/0074630 A1* | 4/2003 | Batson | G11C 15/043 |
| | | | 711/108 |
| 2007/0061692 A1* | 3/2007 | Wickeraad | G06F 11/1064 |
| | | | 714/801 |
| 2012/0110411 A1 | 5/2012 | Cheung et al. | |

OTHER PUBLICATIONS

Biswas et al., "Computing Architectural Vulnerability Factors for Address-Based Structures," ISCA '05: Proceedings of the 32nd annual international symposium on Computer Architecture, May 2005, pp. 532-543.

\* cited by examiner

DUAL REDUNDANT MEMORY RADIATION HARDENING

PRIORITY CLAIM

This application claims benefit to U.S. Provisional Application No. 63/199,349, filed Dec. 21, 2020, the entire contents of which is incorporated herein by reference.

STATEMENT REGARDING FEDERALLY SPONSORED RESEARCH OR DEVELOPMENT

This invention was made with Government support under AFRL RFP Number: FA9453-17-S-0005-CALL-006 awarded by Air Force Research Labs. The Government has certain rights in the invention.

TECHNICAL FIELD

The disclosure relates to computer memory circuitry.

BACKGROUND

When a match word matches a content addressable memory (CAM) word of a CAM array, a CAM macro outputs a random access memory (RAM) word. For example, the CAM macro may output a first RAM word when a match word matches a first CAM word or may output a second RAM word when a match word matches a second CAM word. In this way, a search operation may be performed by the CAM macro, which may be beneficial in various applications, such as, for example, database engines, data compression, neural networks, malware detection, or other applications.

SUMMARY

In random access memory (RAM) architectures, errors may be corrected using various error correction codes (ECCs). However, in content addressable memory (CAM) macros, using ECCs may result in a false match or false miss conditions. As used herein, a CAM macro may refer to a CAM array with match lines that select words in a RAM array. A false match may refer to instances where an error in a CAM cell changes the correct CAM word, which does not match a match word, to an erroneous CAM word, which does match the match word. A false miss condition may refer to instances where an error in a CAM cell changes the correct CAM word, which does match a match word, to an erroneous CAM word, which does not match the match word. As such, some systems may use triple mode redundancy (TMR) to help account for errors in CAM cells.

In accordance with the techniques of the disclosure, dual mode redundancy may be applied to help mitigate false miss conditions and a parity bit check may be applied to help mitigate false matches. For example, circuitry may store CAM data as a first CAM word associated with a first RAM word and store the same CAM data as a second CAM word associated with a second RAM word (e.g., dual mode redundancy). In this example, the circuitry may store a first parity bit for the first CAM word and a second parity bit for the second CAM word. For instance, RAM storing the first RAM word may include the first parity bit. In response to determining that the first CAM word has a parity matching the first parity, the circuitry may output the first CAM word. In response, however, to determining that the first CAM word does not have a parity matching the first parity, the circuitry may refrain from outputting the first CAM word. In this way, the circuitry may minimize or eliminate miss conditions and false matches, which may help to radiation harden the CAM memory.

In one example, this disclosure describes a method for storing data includes determining, using a first match line, that a match word satisfies a first content addressable memory (CAM) word stored in a CAM array, wherein the CAM array is configured to store a second CAM word that matches the first CAM word; in response to determining that the match word satisfies the first CAM word, determining whether a first parity bit associated with the first CAM word matches a first parity of the first CAM word; and in response to determining that the first parity bit associated with the first CAM word matches the first parity of the first CAM word: determining, using the first match line, a first random access memory (RAM) word stored in a RAM array, wherein the RAM array is configured to store a second RAM word that matches the first RAM word and wherein a second match line associates the second CAM word and the second RAM word; and outputting the first RAM word.

In another example, this disclosure describes a device for storing data includes a content addressable memory (CAM) array; a random access memory (RAM) array; and circuitry configured to: determine, using a first match line, that a match word satisfies a first CAM word stored in the CAM array, wherein the CAM array is configured to store a second CAM word that matches the first CAM word; in response to determining that the match word satisfies the first CAM word, determining whether a first parity bit associated with the first CAM word matches a first parity of the first CAM word; and in response to determining that the first parity bit associated with the first CAM word matches the first parity of the first CAM word: determine, using the first match line, a first RAM word stored in the RAM array, wherein the RAM array is configured to store a second RAM word that matches the first RAM word and wherein a second match line associates the second CAM word and the second RAM word; and output the first RAM word.

In another example, this disclosure describes a device for storing data, the device comprising circuitry configured to: determine, using a first match line, that a match word satisfies a first content addressable memory (CAM) word stored in a CAM array, wherein the CAM array is configured to store a second CAM word that matches the first CAM word; in response to determining that the match word satisfies the first CAM word, determining whether a first parity bit associated with the first CAM word matches a first parity of the first CAM word; and in response to determining that the first parity bit associated with the first CAM word matches the first parity of the first CAM word: determine, using the first match line, a first random access memory (RAM) word stored in a RAM array, wherein the RAM array is configured to store a second RAM word that matches the first RAM word and wherein a second match line associates the second CAM word and the second RAM word; and output the first RAM word.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1A:
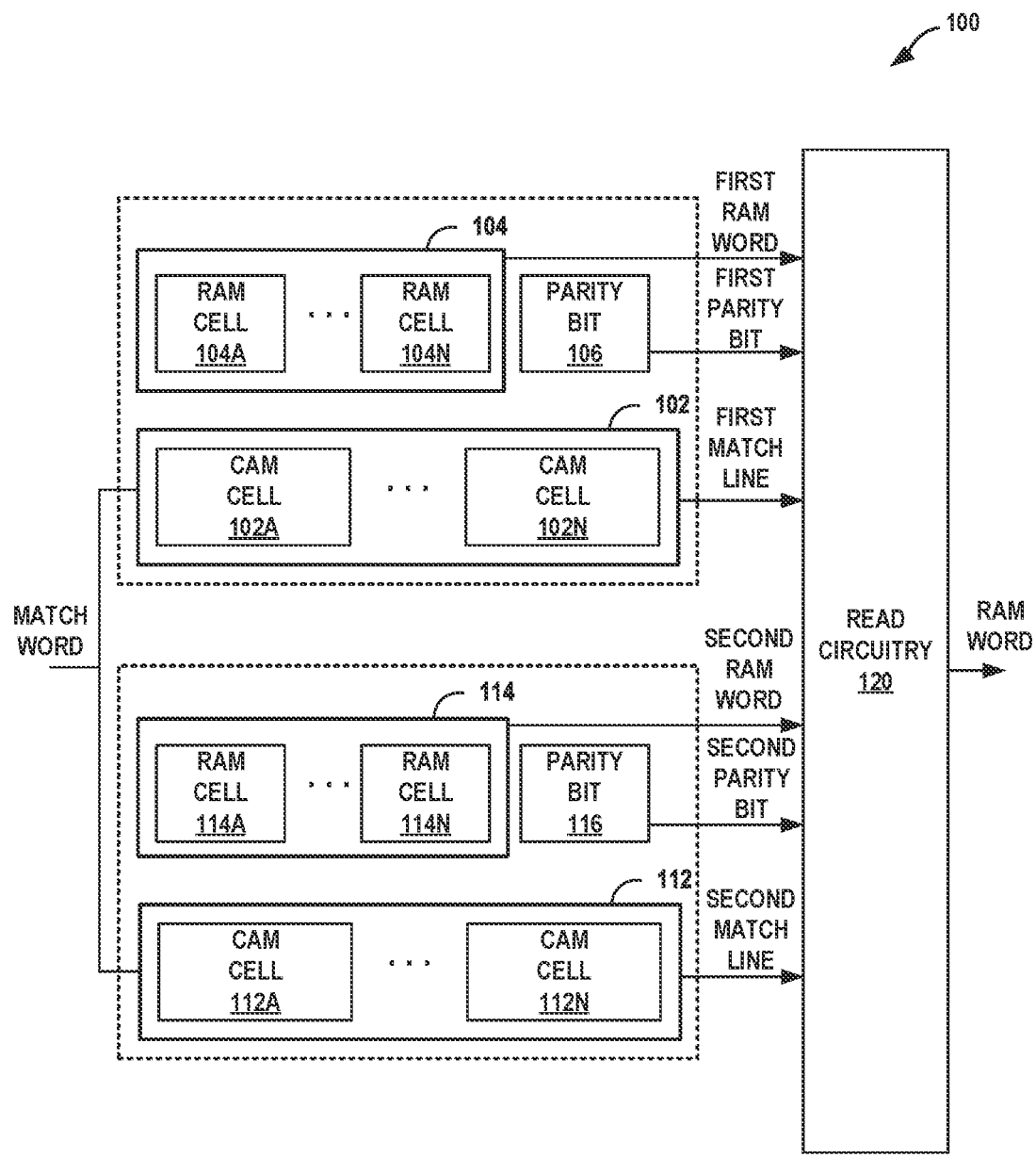
FIG. 1A is a conceptual diagram illustrating an example of a CAM macro with read circuitry configured for dual mode redundancy and a parity check, in accordance with the techniques of the disclosure.

To "harden" memories, some systems rely on error correction codes (ECCs). For example, in random access memory (RAM) architectures, errors may be corrected using various error correction codes (ECCs). For example, each RAM word may be associated with redundant information (e.g., an ECC) that may be used to detect and correct errors that may occur in the RAM word. ECC techniques may be more area efficient than triple mode redundancy (TMR) or dual redundancy in terms of power usage and chip area.

A content addressable memory (CAM) may be used in cache architectures to keep track of memory coherency. A CAM cell and CAM match operations may be sensitive to single event upsets (SEUs). When a single event upset occurs in a CAM, the single event upset may corrupt a stored value or not correct a bad value.

ECC may not be effective to harden CAM words because ECCs may not prevent a false match operation or a false miss conditions. A false match operation may refer to instances where an error in a CAM cell changes the correct CAM word, which does not match a match word, to an erroneous CAM word, which does match the match word. A false miss condition may refer to instances where an error in a CAM cell changes the correct CAM word, which does match a match word, to an erroneous CAM word, which does not match the match word. That is, ECC may not prevent errors from occurring in CAM words because a match may output a CAM word that has self-consistent parity bits or a false mismatch that may not present any need for the parity bits to be checked. As such, some systems may use TMR to help account for errors in CAM cells, which may result in a greater than three times power and area increase. As used herein, TMR may refer to systems that store data in three data entries and output a value resulting from a majority voting of the three data entries.

In accordance with the techniques of the disclosure, a CAM macro may be configured to use dual mode redundancy to store CAM data and a parity bit for each copy of the CAM data to harden against single event upsets. For example, the CAM macro may include dual mode redundancy to help mitigate false miss conditions and apply a parity bit check to help mitigate false matches. For example, circuitry may store CAM data as a first CAM word associated with a first RAM word and store the same CAM data as a second CAM word associated with a second RAM word (e.g., dual mode redundancy). In this example, the circuitry may store a first parity bit for the first CAM word and a second parity bit for the second CAM word. For instance, RAM storing the first RAM word may include the first parity bit. In response to determining that the first CAM word has a parity matching the first parity, the circuitry may output the first CAM word. In response, however, to determining that the first CAM word does not have a parity matching the first parity, the circuitry may refrain from outputting the first CAM word. In this way, the circuitry may minimize or eliminate miss conditions and false matches, which may help to radiation harden the CAM memory.

FIG. 1A is a conceptual diagram illustrating an example of a CAM macro with read circuitry 120 configured for dual mode redundancy and a parity check, in accordance with the techniques of the disclosure. As shown, circuitry 100 may include CAM cells 102A-102N (collectively, CAM cells 102), RAM cells 104A-104N (collectively, RAM cells 104), a parity bit 106, CAM cells 112A-112N (collectively, CAM cells 112), RAM cells 114A-114N (collectively, RAM cells 114), a parity bit 116, and read circuitry 120. CAM cells 102, 112 may form a CAM array. RAM cells 104, 114 may form a RAM array. The CAM array formed by CAM cells 102, 112 and the RAM array formed by RAM cells 104, 114 may form a CAM macro. As used herein, a CAM macro may refer to a CAM array with match lines that select words in a RAM array.

CAM cells 102 may store a first CAM word. As used herein, a CAM cell (e.g., CAM cells 102, 112) may refer to a memory cell that can be searched and indicates a match if the contents of the cell are the same as differential match bit lines. A CAM word (e.g., the first CAM word or the second CAM word) may refer to an array of CAM cells that makes of a stored CAM address. Again, CAM cells 102, 112 may form or be part of a CAM array. As used herein, a CAM array may refer to an array of CAM words that is capable of simultaneously being searched for a CAM word that is the same as the match word. While circuitry 100 includes two CAM words, CAM arrays may include more than two CAM words (e.g., see FIG. 2).

When a match word satisfies (e.g., matches) the first CAM word stored by CAM cells 102, CAM cells 102 output a first match line indicating that the match word matches the first CAM word. As used herein, a match word may refer to an address word that is searched for in the in a CAM array. A match line may refer to a signal for each word (e.g., first CAM word or second CAM word) in the CAM array that indicates if the match word is found or not.

Similarly, CAM cells 112 may store a second CAM word. When the match word satisfies (e.g., matches) the second CAM word stored by CAM cells 112, CAM cells 112 output a second match line indicating that the match word matches the second CAM word. In this example, CAM cells 102, 112 provide dual redundancy. For example, CAM cells 102 store the first CAM word to match the second CAM word stored by CAM cells 112. Configuring CAM cells 102, 112 for dual redundancy may help mitigate false miss conditions, which may potentially harden the memory to single event upsets.

RAM cells 104, 114 may form or be part of a RAM array. As used herein, a RAM array may refer to a corresponding data word for each CAM word (e.g., the first CAM word and the second CAM word). The RAM array may be indexed by the match line. For instance, the first match line output by CAM cells 102 may indicate a RAM address for RAM array 104. Similarly, the second match line output by CAM cells 112 may indicate a RAM address for RAM array 114. RAM cells 104 may store a first RAM word. Similarly, RAM cells 114 may store a second RAM word. In this example, RAM cells 104, 114 provide dual redundancy. For example, RAM cells 104 store the first RAM word to match the second RAM word stored by RAM cells 114. Configuring RAM cells 104, 114 to apply dual redundancy may help mitigate false miss conditions, which may potentially harden the memory to single event upsets.

Parity bit 106 may store a parity of the first CAM word. For instance, parity bit 106 may store the parity of the first CAM word when initially stored by CAM cells 102. Parity bit 106 may be stored in RAM. In some examples, parity bit 106 may apply TMR. For example, parity bit 106 may include three or more bits that each store the parity of the first CAM word (e.g., when storing the first CAM word at CAM cells 102). In this example, parity bit 106 may output a majority of the values stored by the three or more bits (e.g., majority voting). Due to errors that may occur after initially storing the first CAM word in CAM cells 102, one or more bits stored by CAM cells 102 may change. As such, a parity of the first word stored by CAM cells 102 may be different than parity bit 106.

Parity bit 116 may store a parity of the second CAM word. For instance, parity bit 116 may store the parity of the second CAM word when initially stored by CAM cells 112. Parity bit 116 may be stored in RAM. In some examples, parity bit 116 may apply TMR. For example, parity bit 116 may include three or more bits that each store the parity of the second CAM word (e.g., when storing the second CAM word at CAM cells 112). In this example, parity bit 116 may output a majority of the values stored by the three or more bits (e.g., majority voting). Due to errors that may occur after initially storing the second CAM word in CAM cells 112, one or more bits stored by CAM cells 112 may change. As such, a parity of the second word stored by CAM cells 112 may be different than parity bit 116.

Read circuitry 120 may be configured to work with CAM cells 102, 112 to output a RAM word responsive to a match word. Read circuitry 120 may include an analog circuit. In some examples, read circuitry 120 may be a microcontroller on a single integrated circuit containing a processor core, memory, inputs, and outputs. For example, read circuitry 120 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor," "processing circuitry" or "circuitry" may generally refer to any of the foregoing logic circuitry, alone or in combination with other logic circuitry, or any other equivalent circuitry. In some examples, read circuitry 120 may be a combination of one or more analog components and one or more digital components.

In operation, read circuitry 120 may determine, using a first match line, that a match word satisfies a first CAM word stored in CAM cells 102. For example, read circuitry 120 may receive an indication (e.g., a RAM address) from the first match line output by CAM cells 102 that the match word matches satisfies the first CAM word stored in CAM cells 102. Again, CAM cells 102, 112 may be configured for dual redundancy. For example, CAM cells 112 may be configured to store the second CAM word that matches the first CAM word.

In response to determining that the match word satisfies the first CAM word, read circuitry 120 may determine whether first parity bit 106 matches a first parity of the first CAM word stored by CAM cells 102. For example, read circuitry 120 may determine a first parity of the first CAM word currently stored by CAM cells 102 and compare first parity bit 106 and the first parity.

In response to determining that the first parity bit associated with the first CAM word matches the first parity of the first CAM word, read circuitry 120 may determine, using the first match line, a first RAM word stored in a RAM array. For example, read circuitry 120 may determine an address for RAM cells 104 indicated by the first match line. In this example, read circuitry 120 may fetch the first RAM word stored in RAM cells 104. Again, RAM cells 104, 114 may be configured for dual redundancy. For example, RAM cells 114 may be configured to store the second RAM word that matches the first RAM word. Similarly, a second match line may associate the second CAM word and the second RAM word. Read circuitry 120 may output the first RAM word as the RAM word responsive to the match word.

In response, however, to determining that the first parity bit associated with the first CAM word does not match the first parity of the first CAM word, read circuitry 120 may determine that the first CAM word represents a false match operation. In response to determining that the first CAM word represents the false match operation, read circuitry 120 may refrain from outputting the first RAM word as the RAM word responsive to the match word. In some examples, read circuitry 120 may refrain from fetching the first RAM word stored in RAM cells 104 in response to determining that the first CAM word represents the false match operation. In this way, read circuitry 120 may use parity bit 106 to apply a parity bit check, which may reduce false matches.

As such, circuitry 100 may represent circuitry that includes two copies of the CAM word and RAM word (e.g., dual redundancy) with a parity bit (e.g., parity bits 106, 116) stored with each copy of the CAM word and RAM word. During a read out operation, circuitry 100 may perform a read operation on both copies of the CAM word and RAM word and both parity bits. In this example, circuitry 100 may use the CAM word that matches the parity bit as the correct output. In this way, techniques described herein for configuring a CAM macro with dual redundancy and a parity bit may potentially provide the same single event upset hardening benefit as TMR with little more than twice area/power penalty compared to memory systems that do not provide single event upset hardening benefits. TMR provides a hardening technique to address errors assuming CAM data does not sit for a long time accumulating an error in two bits of the same CAM word in two different CAM macros within the TMR group. However, in comparison. TMR provide the single event upset hardening benefit with about three times the area/power penalty compared to memory systems that do not provide single event upset hardening benefits.

Figure 1B:
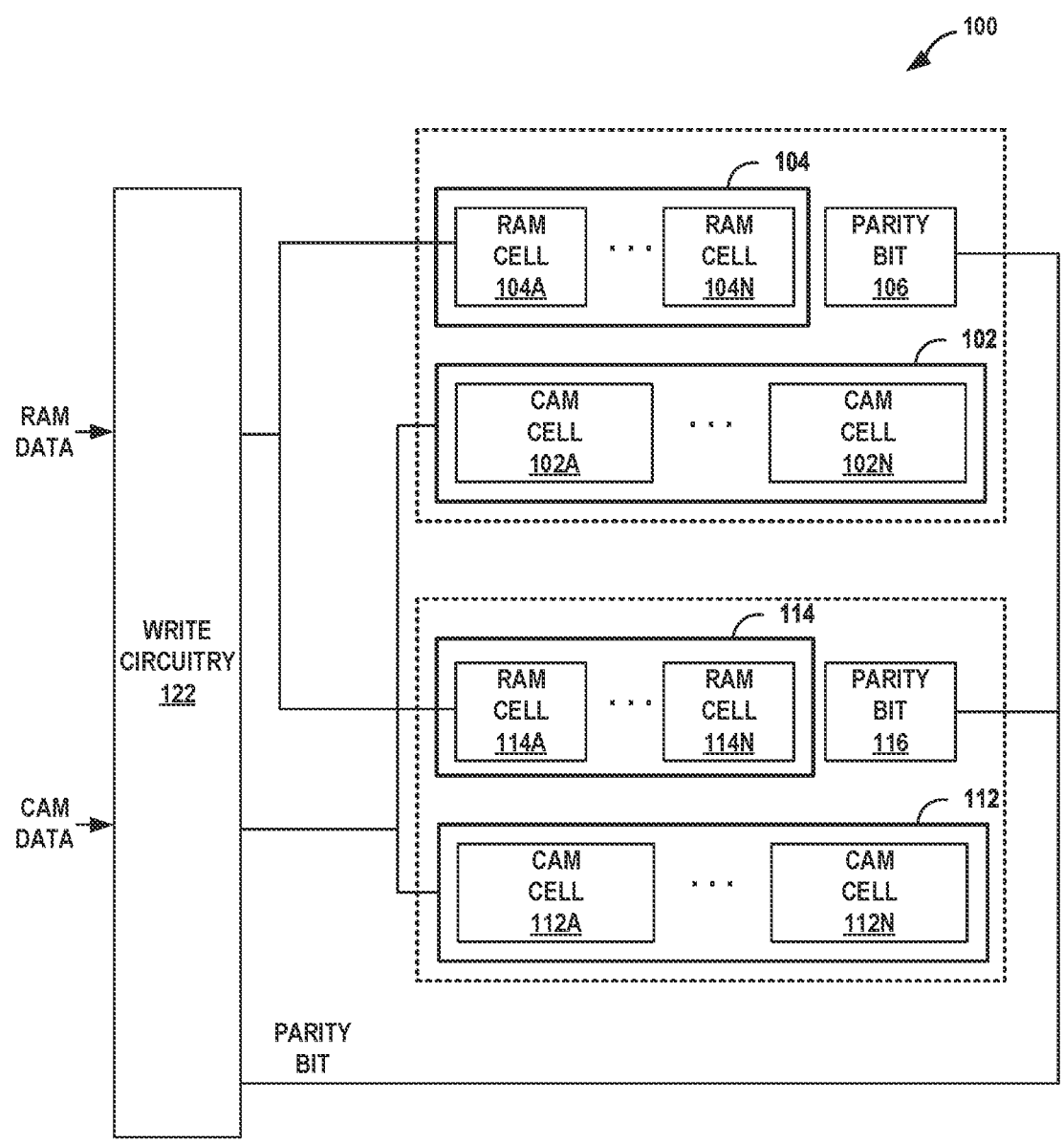
FIG. 1B is a conceptual diagram illustrating an example of a CAM macro with write circuitry configured for dual mode redundancy and a parity check, in accordance with the techniques of the disclosure.

FIG. 1B is a conceptual diagram illustrating an example of a CAM macro with write circuitry 122 configured for dual mode redundancy and a parity check, in accordance with the techniques of the disclosure. As shown, circuitry 100 may further include write circuitry 122. In some examples, read circuitry 120 and write circuitry 122 may be combined and may be referred to herein as simply "circuitry."

Write circuitry 122 may be configured to work with CAM cells 102, 112 and RAM cells 104, 114 to configure circuitry 100 (e.g., a CAM macro) to output RAM data in response to matching a match word with CAM data. Write circuitry 122 may include an analog circuit. In some examples, write circuitry 122 may be a microcontroller on a single integrated circuit containing a processor core, memory, inputs, and outputs. For example, write circuitry 122 may include one or more processors, including one or more microprocessors, DSPs, ASICs, FPGAs, or any other equivalent integrated or discrete logic circuitry, as well as any combinations of such components. In some examples, write circuitry 122 may be a combination of one or more analog components and one or more digital components.

In operation, write circuitry 122 may receive CAM data indicating a plurality of bit values. Write circuitry 122 may receive RAM data indicating a second plurality of bit values. In this example, write circuitry 122 may set a first plurality of cells of the CAM array that form the first CAM word to represent the first plurality of bit values. For instance, write circuitry 122 may set CAM cells 102 to represent the CAM data. Similarly, write circuitry 122 may set a second plurality of cells of the CAM array that form the second CAM word to represent the plurality of bit values. For instance, write circuitry 122 may set CAM cells 112 to represent the CAM data.

Write circuitry 122 may set a first plurality of cells of the RAM array that form the first RAM word to represent the second plurality of bit values. For instance, write circuitry 122 may set RAM cells 104 to represent the RAM data. Similarly, write circuitry 122 may set a second plurality of cells of the second RAM array that form the second RAM word to represent the second plurality of bit values. For instance, write circuitry 122 may set RAM cells 114 to represent the RAM data.

Write circuitry 122 may set the first parity bit associated with the first CAM word and the second parity bit associated with the second CAM word to a parity of the CAM data. For example, write circuitry 122 may calculate a parity of the CAM data when setting the first CAM word in CAM cells 102 to represent the CAM data. In this example, write circuitry 122 may set parity bit 106 to the parity of the parity of the CAM data when setting the first CAM word in CAM cells 102 to represent the CAM data. Similarly, write circuitry 122 may set parity bit 116 to the parity of the parity of the CAM data when setting the second CAM word in CAM cells 112 to represent the CAM data.

In some examples, dual redundancy may be omitted. For example, CAM data may be stored in as single CAM word and RAM data may be stored in a single RAM word. In this example, write circuitry 122 may store a parity of the CAM word as a bit in the RAM word. If the parity bit mismatches the match word parity, read circuitry 120 of FIG. 1A, may not use the matched RAM word. However, if the party bit matches the match word parity, read circuitry 120 may use the RAM word. In this way, the parity check may significantly improves the false match error rate. However, using dual redundancy may help to improve the missed match error rate.

In accordance with the techniques of the disclosure, write circuitry 122 may store CAM addresses in two redundant arrays (e.g., a dual redundant technique). Assume a match if either CAM address matches (e.g., a NAND style CAM cell of FIG. 4). If the parity bit mismatches the match word parity, read circuitry 120 may not use the matched RAM word. However, if the parity bit mismatches the match word parity, read circuitry 120 may not use the RAM word. Using a CAM macro with dual redundancy and a parity check may potentially improve both the false match error rate and the missed match error rate.

In some examples, RAM cells 104, 114 may be hardened. For example, write circuitry 122 may save a RAM parity bit for the first RAM word in addition to the parity bit (e.g., a CAM parity bit) for the first CAM word. If the RAM parity bit mismatches a parity of the first RAM word, read circuitry 120 may not use the first RAM word. However, if the RAM parity bit matches a parity of the first RAM word, read circuitry 120 may use the first RAM word. Using a CAM macro with dual redundancy, a CAM parity check, and a RAM parity check may potentially improve both the false match error rate and the missed match error rate of the CAM macro. In this way, the CAM macro may harden against upsets in the RAM word that may have occurred and may allow read circuitry 120 to choose a RAM word that is not corrupted.

In some examples, write circuitry 122 may store multiple copies (e.g., two copies, three copies, or more than three copies) of the parity bit (e.g., parity bits 106, 116) because the parity bit upset rate may represent a limiting factor. In some examples, write circuitry 122 may store the parity bit as a CAM bit instead or in addition to the CAM parity bit stored in the RAM array. In some examples, write circuitry 122 may store ECC bits of the CAM match word (e.g., the first CAM word or the second CAM word) and verify there was no upset in the match word/ECC bits.

Figure 2:
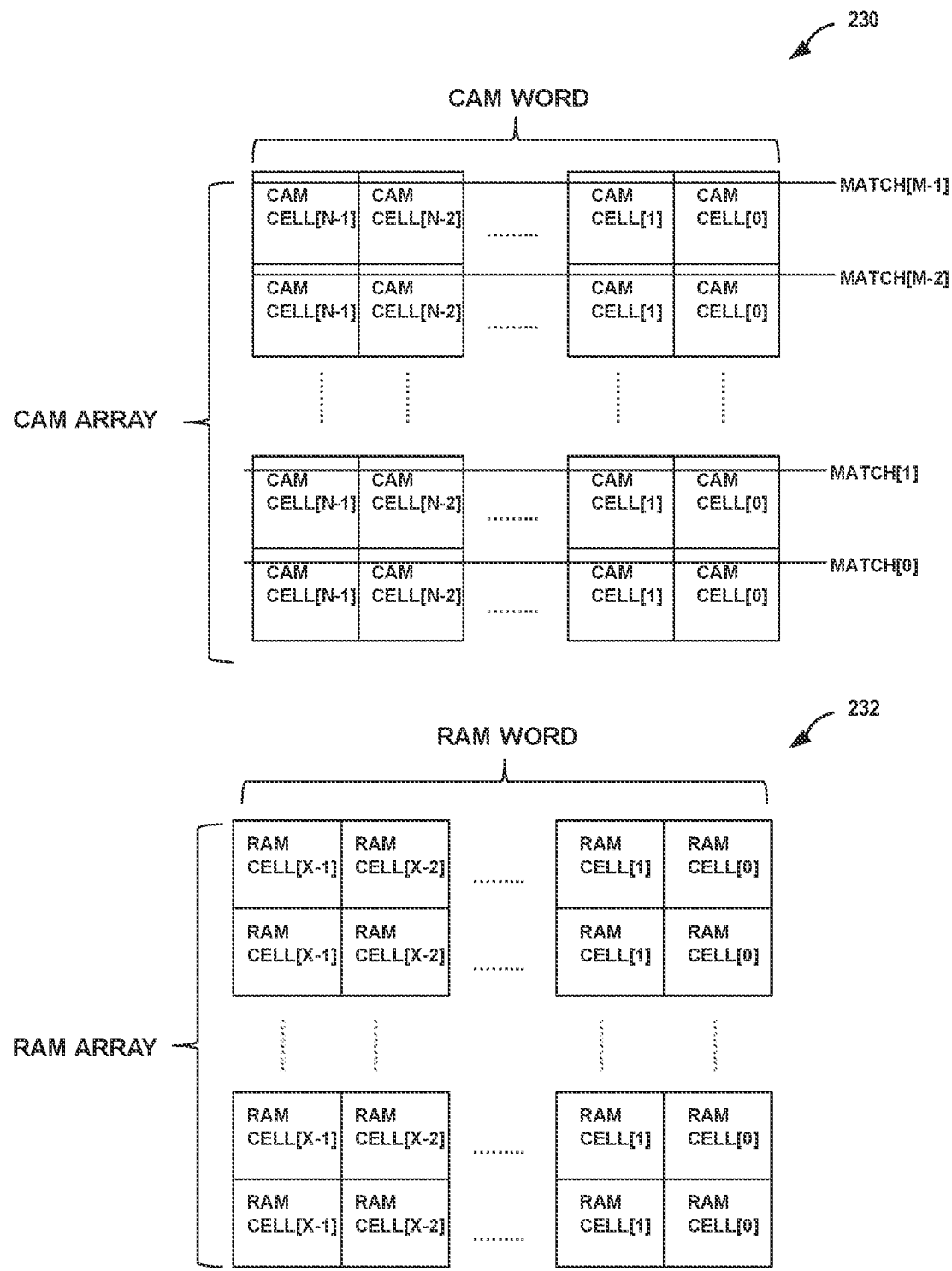
FIG. 2 is a conceptual diagram illustrating an example of a CAM array and a RAM array, in accordance with the techniques of the disclosure.

FIG. 2 is a conceptual diagram illustrating an example of a CAM array 230 and a RAM array 232, in accordance with the techniques of the disclosure. CAM array 230 may include CAM cells 102, 112 of FIG. 1. RAM array 232 may include RAM cells 104, 114 of FIG. 1.

Single event upset and/or single event transient (SET) error rates for the CAM macro for a match cycle may include a missed match word probability and a false match word probability. The missed match word probability may represent a word that does not match and may be calculated as follows.

CAMcellSEUstatic*TimeSinceWritten*NumCAMcellsin Word+
MatchLineSET*match_cycle_time*NumCAMcellsin Word)*PercentageMatchingCycles where CAMcell-SEUstatic represents a probability that a CAM cell will result in a SEU error, TimeSinceWritten represents a time since the CAM cell was written, NumCAMcells-InWord represents a number of CAM cells in a CAM word, MatchLineSET represents a probability that the CAM cell will result in an SET error, match_cycle_time represents a time to cycle between CAM cells of the CAM word, NumCAMcellsInWord represents a number of CAM cells of the CAM word, Percentage-MatchingCycles represents a percentage of matching cycles.

The false match word probability may represent a match word and CAM word match that should not occur and may be calculated as follows:
(CAMcellSEUstatic*TimeSinceWritten+
MatchLineSET*match_cycle_time)*NumRowsOne-MismatchingBit where NumRowsOneMismatchingBit represents a number of rows with one mismatching bit.

A first error rate is likely larger than a second by a factor of the NumCAMcellsInWord assuming the Percentage-MatchingCycles is similar to NumRowsOneMismatchingBit.

Error rates for simply saving the parity bit in the RAM array and using a single copy of the CAM word and RAM word is discussed in the following. Systems that use a single CAM word and a parity check may have no change in missed match word probability compared to systems that use a single CAM word and omit a parity check. That is, the missed match word probability of a systems using a single CAM word and a parity check may be calculated as follows.

CAMcellSEUstatic*TimeSinceWritten*NumCAMcellsIn Word+
MatchLineSET*match_cycle_time*NumCAMcellsIn Word)*PercentageMatchingCycles However, systems that use a single CAM word and a parity check may comprise an improved change (e.g., the error rate is for double bit rate error) in false match probability compared to systems that use a single CAM word and omit a parity check. That is, the false match probability of a systems using a single CAM word and a parity check may be calculated as follows.

~((CAMcellSEUstatic*TimeSinceWritten+
MatchLineSET*match_cycle_time)*NumRowsOne-MismatchingBit)^2

There may be an additional error rate to account for the parity bit. This improvement of using a parity check may be limited by NumCAMcellsInWord. For the false match portion of the error rate, the overall error rate is not reduced significantly for very large CAM words because the missed match probability will still be significant.

Parity bit plus dual redundant techniques are discussed in the following. Configuring circuitry 100 to use a parity bit plus dual redundant techniques may largely eliminate a missed match word probability. The error rate may be for two errors, one in each of the dual redundant CAM words. As such, the missed match probability of a systems using a dual CAM word and a parity check may be calculated as follows.

~((CAMcellSEUstatic*TimeSinceWritten)
^2*NumCAMcellsInWord+
((MatchLineSET*match_cycle_time)
^2*NumCAMcellsInWord)
*PercentageMatchingCycles Moreover, the parity check may eliminate single bit contribution for false match word probability (e.g., the error rate is for double bit rate error) compared to systems that use a single CAM word and omit a parity check. That is, the false match probability of a systems using a single CAM word and a parity check may be calculated as follows.

~((CAMcellSEUstatic*TimeSinceWritten+
MatchLineSET*match_cycle_time)*NumRowsOne-MismatchingBit)^2

There may be an additional error rate to account for the parity bit. This improvement of using a parity check and dual redundancy may be limited by NumCAMcellsInWord. For the false match probability and missed match probability, the error rate of the parity bit which is likely about the same as the CAM bit error rate limit.

Parity bit plus dual redundant plus TMR of parity bit techniques are discussed in the following. Configuring circuitry 100 to use a parity bit plus dual redundant techniques with a TMR scheme for the parity bit may largely eliminate a missed match word probability. The error rate may be for two errors, one in each of the dual redundant CAM words. As such, the missed match probability of a systems using a dual CAM word and a parity check may be calculated as follows.

~((CAMcellSEUstatic*TimeSinceWritten)^2*NumCA
McellsInWord+((MatchLineSET*match_cycle_time)
^2*NumCAMcellsInWord)*PercentageMatching-Cycles Moreover, the parity check may eliminate single bit contribution for false match word probability (e.g., the error rate is for double bit rate error) compared to systems that use a single CAM word and omit a parity check. That is, the false match probability of a systems using a single CAM word and a parity check may be calculated as follows.

~((CAMcellSEUstatic*TimeSinceWritten+
MatchLineSET*match_cycle_time)*NumRowsOn-cMismatchingBit)^2

Further, using TMR to store the parity bit (e.g., parity bits 106, 116) may improve the parity bit error rate by approximately the square of the bit cell error rate compared to systems that use a single CAM word and omit a parity check. As such, the overall improvement is significant and a remaining upset rate of the CAM macro is limited to a first order that is approximately the square of the upset rate of the unhardened cell.

Figure 3:
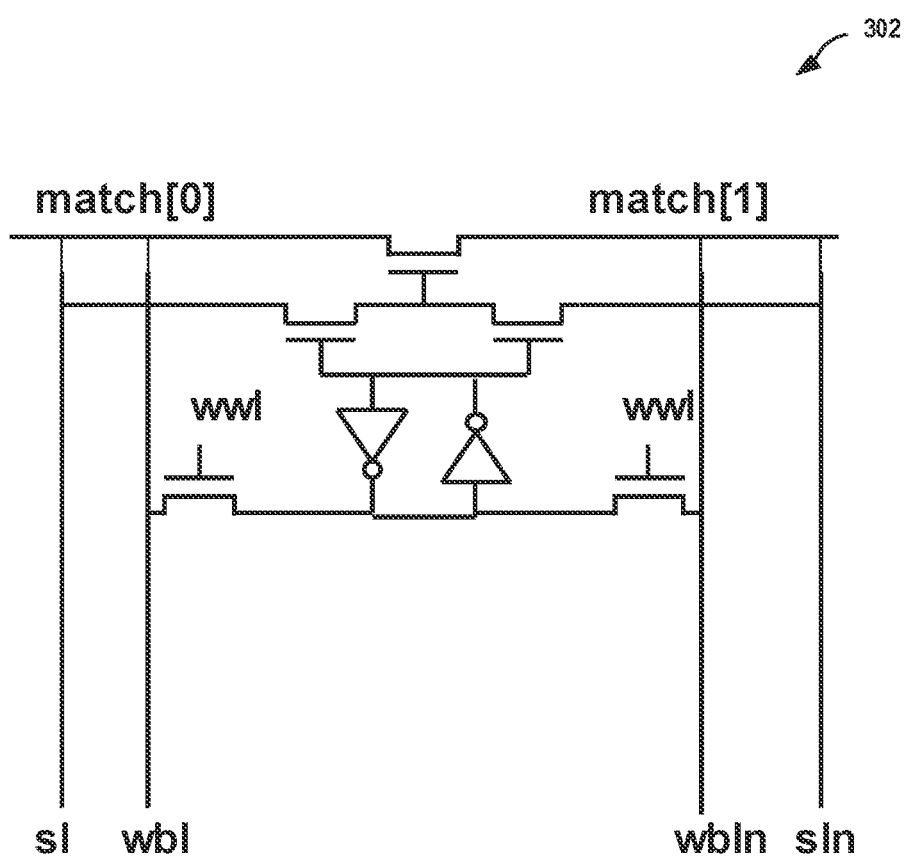
FIG. 3 is a conceptual diagram illustrating an example NOR CAM cell, in accordance with the techniques of the disclosure.

FIG. 3 is a conceptual diagram illustrating an example NOR CAM cell 302, in accordance with the techniques of the disclosure. NOR CAM cell 302 may be an example of one or more of CAM cells 102, 112 of FIG. 1. Source line ("sl") and a complimentary source line ("sln") may represent a bit of a match word. Write word line ("wwl") may represent a write operation is to be performed on NOR CAM cell 302. Write bit line ("wbl") and a complimentary write bit line ("wbln") may represent a bit line for NOR CAM cell 302. Match[0] may represent a first match line. Match[1] may represent a second match line.

A match for NOR CAM cell 302 may occur when a high value is sent through the CAM word and reaches the end. There is a match driver at the start of the word and can be a keeper at the end of the word that needs to be switched high.

Figure 4:
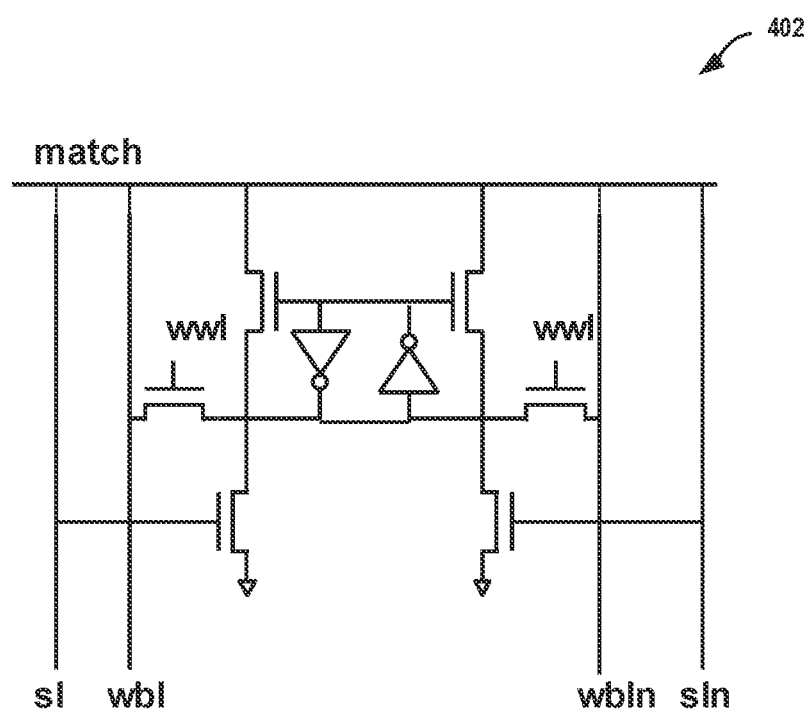
FIG. 4 is a conceptual diagram illustrating an example NAND CAM cell, in accordance with the techniques of the disclosure.

FIG. 4 is a conceptual diagram illustrating an example NAND CAM cell 402, in accordance with the techniques of the disclosure. NAND CAM cell 402 may be an example of one or more of CAM cells 102, 112 of FIG. 1. Source line ("sl") and a complimentary source line ("sln") may represent a bit of a match word. Write word line ("wwl") may represent a write operation is to be performed on NAND CAM cell 402. Write bit line ("wbl") and a complimentary write bit line ("wbln") may represent a bit line for NAND CAM cell 402. Match may represent a match line for NAND CAM cell 402. A match for NAND CAM cell 402 may occur when one match line is not discharged. All non-matching rows may be discharged.

CAM power during a compare/match operation is consumed by one of the SL/SLN lines being discharged in for each bit of the match word and either 1) all the discharging match lines for NAND CAM cell 402 or 2) the matching fraction of match cells in NOR CAM cell 302. For this approach, NOR CAM cell 302 may be slower but consume less power than NAND CAM cell 402.

Figure 5:
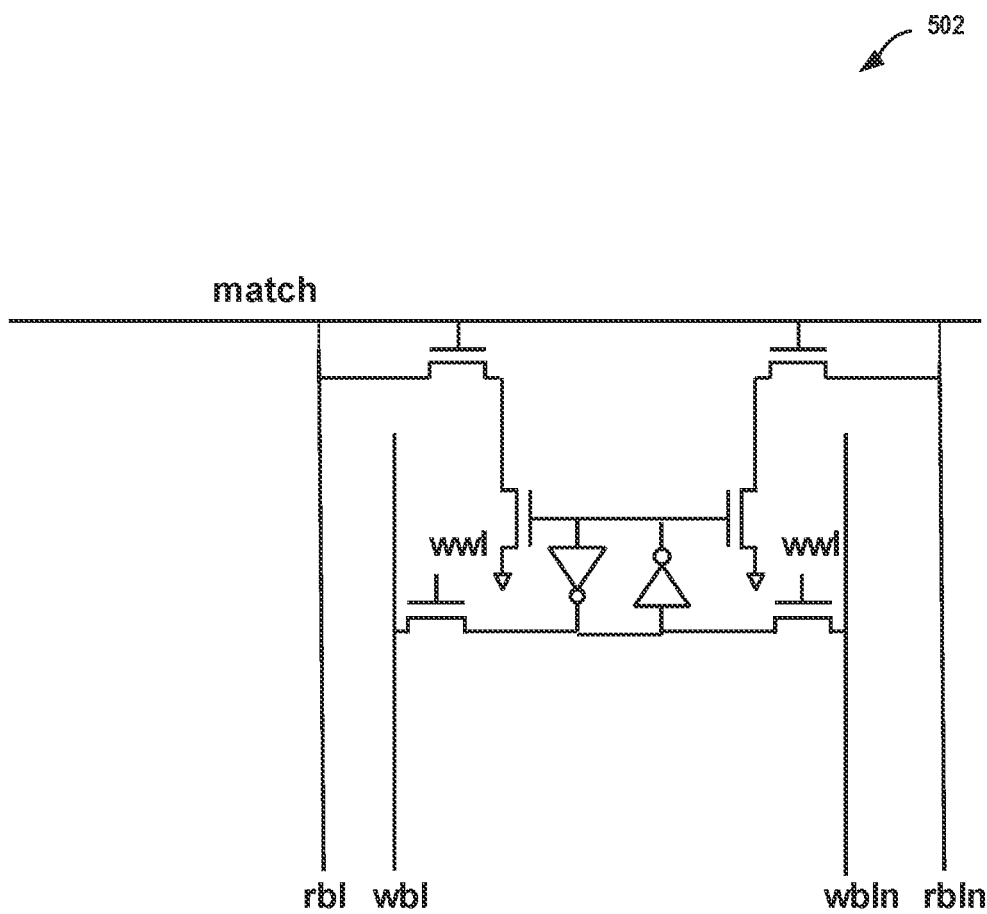
FIG. 5 is a conceptual diagram illustrating a first example SRAM CAM cell, in accordance with the techniques of the disclosure.

FIG. 5 is a conceptual diagram illustrating an example SRAM CAM cell 502, in accordance with the techniques of the disclosure. SRAM CAM cell 502 may be an example of one or more of CAM cells 102, 112 of FIG. 1. Read bit line ("rbl") and a complimentary read bit line ("rbln") may represent a bit of a match word. Write word line ("wwl") may represent a write operation is to be performed on NAND CAM cell 402. Write bit line ("wbl") and a complimentary write bit line ("wbln") may represent a bit line for SRAM CAM cell 502. Match may represent a match line for SRAM CAM cell 502.

Figure 6:
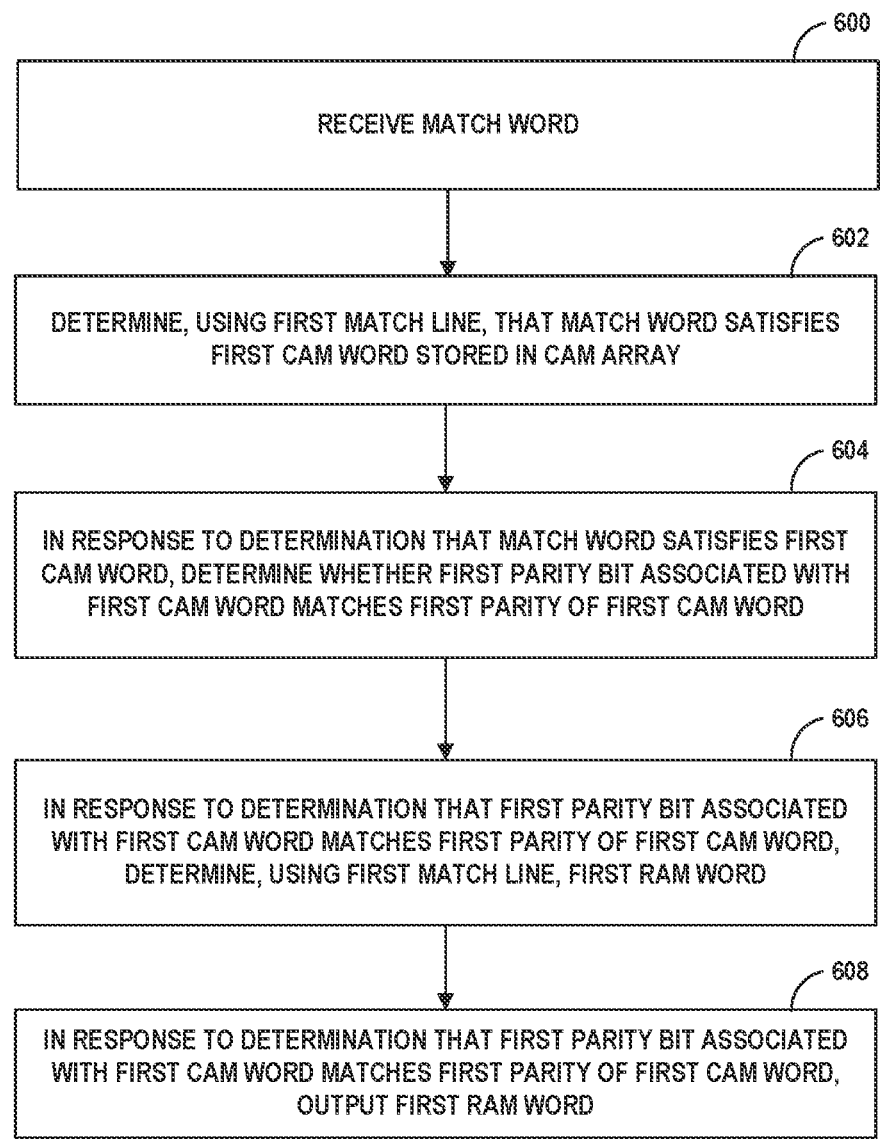
FIG. 6 is a flow chart illustrating a first example operation of reading a CAM macro according to one or more techniques of this disclosure.

FIG. 6 is a flow chart illustrating a first example operation of reading a CAM macro according to one or more techniques of this disclosure. FIG. 6 is discussed with reference to FIGS. 1-5 for example purposes only.

Read circuitry 120 receives a match word (600). Read circuitry 120 may determine, using a first match line, that a match word satisfies a CAM word stored in a CAM array (602). For example, read circuitry 120 may determine that the match word satisfies a first CAM word stored by CAM cells 102 in response to the first match line indicating an address for RAM cells 104. The CAM array may be configured to store a second CAM word that matches the first CAM word. For example, circuitry 100 may include CAM cells 112 configured to store the second CAM word that matches the first CAM word to provide dual redundancy. Again, RAM cells 102, 112 may include one or more NOR CAM cells, NAND CAM cells, and/or SRAM CAM cells.

In response to determining that the match word satisfies the first CAM word, read circuitry 120 may determine whether a first parity bit associated with the first CAM word matches a first parity of the first CAM word (604). For example, read circuitry 120 determines whether a parity for the first CAM word matches parity bit 106. In some examples, read circuitry 120 may determine the first parity bit as a majority of three or more parity bits associated with the first CAM word. Additionally, or alternatively, parity bit 106 may be stored in a RAM array formed by RAM cells 104, 114.

In response to determining that the first parity bit associated with the first CAM word matches the first parity of the first CAM word, read circuitry 120 may determine, using the first match line, a first RAM word stored in a RAM array (606). For example, read circuitry 120 may fetch data stored at the address for RAM cells 114 indicated by the first match line. The RAM array may be configured to store a second RAM word that matches the first RAM word and wherein a second match line associates the second CAM word and the second RAM word. For example, circuitry 100 may include RAM cells 114 configured to store the second RAM word that matches the first RAM word to provide dual redundancy. In response to determining that the first parity bit associated with the first CAM word matches the first parity of the first CAM word, read circuitry 120 may output the first RAM word (608).

Figure 7:
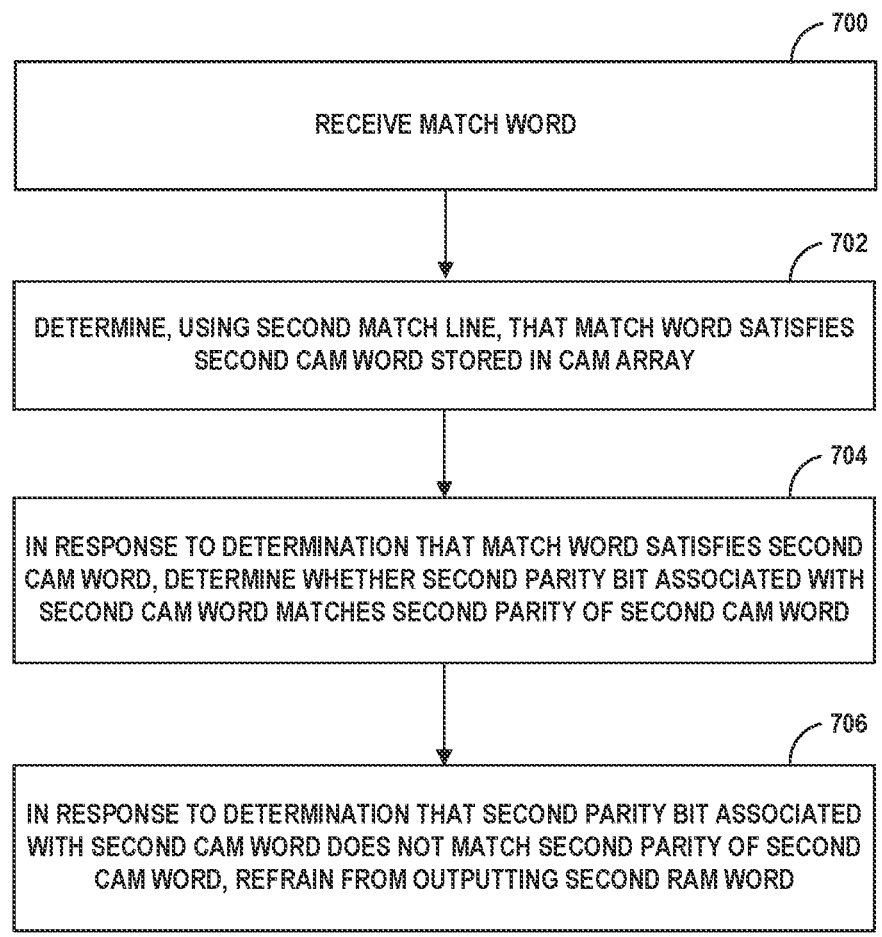
FIG. 7 is a flow chart illustrating a second example operation of reading a CAM macro according to one or more techniques of this disclosure.

FIG. 7 is a flow chart illustrating a second example operation of reading a CAM macro according to one or more techniques of this disclosure. FIG. 7 is discussed with reference to FIGS. 1-6 for example purposes only. The steps of FIG. 7 may be performed concurrently or before performing the steps of FIG. 6. In some examples, the steps of FIG. 7 are performed before the step of outputting the first RAM word of FIG. 6 (e.g., step 608).

Read circuitry 120 receives a match word (700). Read circuitry 120 may determine, using a second match line, that the match word satisfies the second CAM word (702). For example, read circuitry 120 may determine that the match word satisfies a second CAM word stored by CAM cells 112 in response to the second match line indicating an address for RAM cells 114. In response to determining that the match word satisfies the second CAM word, read circuitry 120 may determine whether a second parity bit associated with the second CAM word matches a second parity of the second CAM word (704). For example, read circuitry 120 may determine whether a parity for the second CAM word matches parity bit 116. In response to determining that the second parity bit associated with the second CAM word does not match the second parity of the second CAM word, read circuitry 120 may refrain from outputting the second RAM word (706). In this way, circuitry 100 may minimize or eliminate miss conditions and false matches, which may help to radiation harden the CAM memory.

Figure 8:
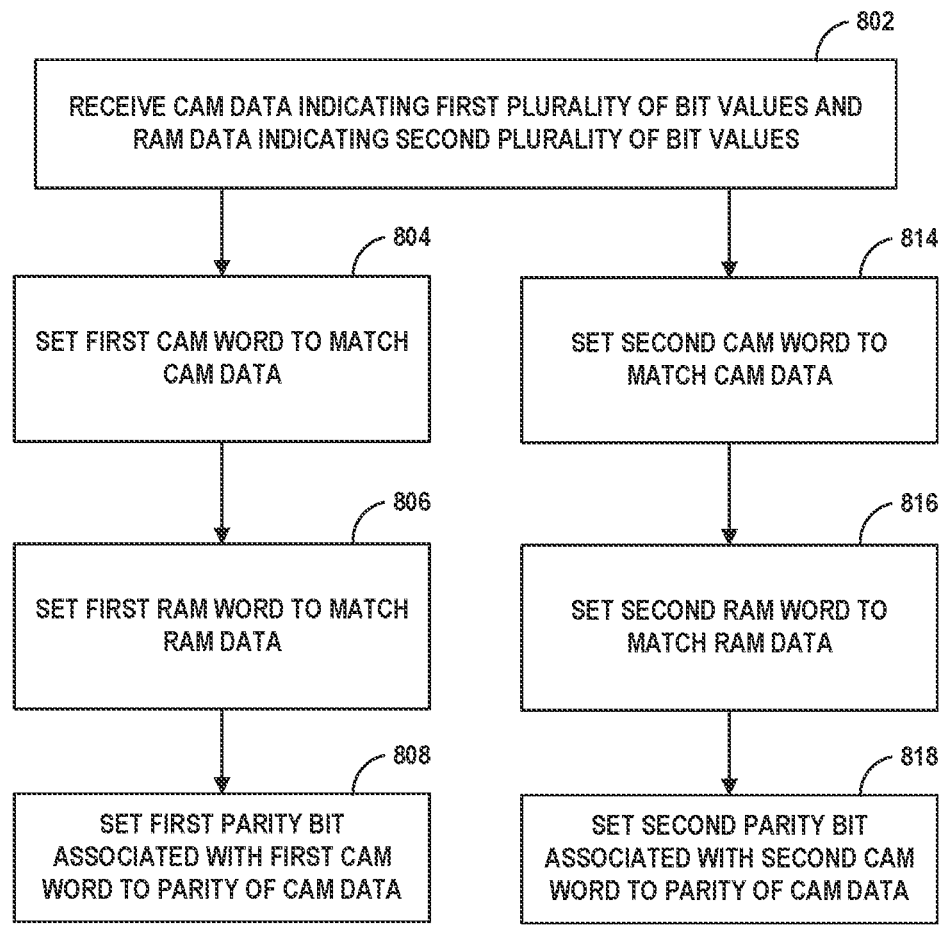
FIG. 8 is a flow chart illustrating an example operation of writing to a CAM macro according to one or more techniques of this disclosure.

FIG. 8 is a flow chart illustrating an example operation of writing to a CAM macro according to one or more techniques of this disclosure. FIG. 8 is discussed with reference to FIGS. 1-7 for example purposes only.

Write circuitry 122 may receive CAM data indicating a plurality of bit values and RAM data indicating a second plurality of bit values (802). Write circuitry 122 may set the first CAM word to match the CAM data (804) and set the first RAM word to match the RAM data (806). In this example, write circuitry 122 may set the first parity bit associated with the first CAM word (e.g., parity bit 106) to a parity of the CAM data (808).

Concurrently, before, or after performing the steps 804-808, write circuitry 122 may set the second CAM word to match the CAM data (814) and set the second RAM word to match the RAM data (816). In this example, write circuitry 122 may set the second parity bit associated with the second CAM word (e.g., parity bit 116) to a parity of the CAM data (818). In this way, the circuitry may minimize or eliminate miss conditions and false matches, which may help to radiation harden the CAM memory.

Various examples of the disclosure have been described. These and other examples are within the scope of the following claims.

What is claimed is:

1. A method for storing data, the method comprising:
   determining, using a first match line, that a match word satisfies a first content addressable memory (CAM) word stored in a CAM array, wherein the CAM array is configured to store a second CAM word that matches the first CAM word to provide dual mode redundancy;
   in response to determining that the match word satisfies the first CAM word, determining whether a first parity bit associated with the first CAM word matches a first parity of the first CAM word to prevent a false match operation; and
   in response to determining that the first parity bit associated with the first CAM word matches the first parity of the first CAM word:
      determining, using the first match line, a first random access memory (RAM) word stored in a RAM array, wherein the RAM array is configured to store a second RAM word that matches the first RAM word and wherein a second match line associates the second CAM word and the second RAM word; and
      outputting the first RAM word.

2. The method of claim 1, comprising, before outputting the first RAM word:
   determining, using a second match line, that the match word satisfies the second CAM word;
   in response to determining that the match word satisfies the second CAM word, determining whether a second parity bit associated with the second CAM word matches a second parity of the second CAM word; and
   in response to determining that the second parity bit associated with the second CAM word does not match the second parity of the second CAM word, refraining from outputting the second RAM word.

3. The method of claim 1, further comprising determining the first parity bit as a majority of three or more parity bits associated with the first CAM word.

4. The method of claim 1, further comprising fetching the first parity bit from the RAM array.

5. The method of claim 1, comprising:
receiving CAM data indicating a plurality of bit values and RAM data indicating a second plurality of bit values;
setting the first CAM word and the second CAM word to match the CAM data; and
setting the first RAM word and the second RAM word to match the RAM data.

6. The method of claim 5, comprising setting the first parity bit associated with the first CAM word and the second parity bit associated with the second CAM word to a parity of the CAM data.

7. The method of claim 1, wherein the CAM array comprises one or more NOR CAM cells.

8. The method of claim 1, wherein the CAM array comprises one or more NAND CAM cells.

9. The method of claim 1, wherein the CAM array comprises one or more SRAM CAM cells.

10. A device for storing data, the device comprising:
a content addressable memory (CAM) array;
a random access memory (RAM) array; and
circuitry configured to:
determine, using a first match line, that a match word satisfies a first CAM word stored in the CAM array, wherein the CAM array is configured to store a second CAM word that matches the first CAM word to provide dual mode redundancy;
in response to determining that the match word satisfies the first CAM word, determining whether a first parity bit associated with the first CAM word matches a first parity of the first CAM word to prevent a false match operation; and
in response to determining that the first parity bit associated with the first CAM word matches the first parity of the first CAM word:
determine, using the first match line, a first RAM word stored in the RAM array, wherein the RAM array is configured to store a second RAM word that matches the first RAM word and wherein a second match line associates the second CAM word and the second RAM word; and
output the first RAM word.

11. The device of claim 10, wherein the circuitry is configured to, before outputting the first RAM word:
determine, using a second match line, that the match word satisfies the second CAM word;
in response to determining that the match word satisfies the second CAM word, determining whether a second parity bit associated with the second CAM word matches a second parity of the second CAM word; and
in response to determining that the second parity bit associated with the second CAM word does not match the second parity of the second CAM word, refraining from outputting the second RAM word.

12. The device of claim 10, wherein the circuitry is further configured to determine the first parity bit as a majority of three or more parity bits associated with the first CAM word.

13. The device of claim 10, wherein the circuitry is further configured to fetch the first parity bit from the RAM array.

14. The device of claim 10, wherein the circuitry is further configured to:
receive CAM data indicating a plurality of bit values and RAM data indicating a second plurality of bit values;
set the first CAM word and the second CAM word to match the CAM data; and
set the first RAM word and the second RAM word to match the RAM data.

15. The device of claim 14, wherein the circuitry is further configured to set the first parity bit associated with the first CAM word and the second parity bit associated with the second CAM word to a parity of the CAM data.

16. The device of claim 10, wherein the CAM array comprises one or more NOR CAM cells.

17. The device of claim 10, wherein the CAM array comprises one or more NAND CAM cells.

18. The device of claim 10, wherein the CAM array comprises one or more SRAM CAM cells.

19. A device for storing data, the device comprising circuitry configured to:
determine, using a first match line, that a match word satisfies a first content addressable memory (CAM) word stored in a CAM array, wherein the CAM array is configured to store a second CAM word that matches the first CAM word to provide dual mode redundancy;
in response to determining that the match word satisfies the first CAM word, determining whether a first parity bit associated with the first CAM word matches a first parity of the first CAM word to prevent a false match operation; and
in response to determining that the first parity bit associated with the first CAM word matches the first parity of the first CAM word:
determine, using the first match line, a first random access memory (RAM) word stored in a RAM array, wherein the RAM array is configured to store a second RAM word that matches the first RAM word and wherein a second match line associates the second CAM word and the second RAM word; and
output the first RAM word.

20. The device of claim 19, wherein the circuitry is configured to, before outputting the first RAM word:
determine, using a second match line, that the match word satisfies the second CAM word;
in response to determining that the match word satisfies the second CAM word, determining whether a second parity bit associated with the second CAM word matches a second parity of the second CAM word; and
in response to determining that the second parity bit associated with the second CAM word does not match the second parity of the second CAM word, refraining from outputting the second RAM word.

* * * * *